(12) United States Patent
Olsen

(10) Patent No.: US 10,870,911 B2
(45) Date of Patent: Dec. 22, 2020

(54) HIGH PRESSURE AMMONIA NITRIDATION OF TUNNEL OXIDE FOR 3DNAND APPLICATIONS

(71) Applicant: Applied Materials, Inc., Santa Clara, CA (US)

(72) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/292,925

(22) Filed: Mar. 5, 2019

(65) Prior Publication Data
US 2019/0203332 A1 Jul. 4, 2019

Related U.S. Application Data

(62) Division of application No. 15/609,977, filed on May 31, 2017, now abandoned.
(Continued)

(51) Int. Cl.
H01L 21/768 (2006.01)
H01L 21/02 (2006.01)
(Continued)

(52) U.S. Cl.
CPC .......... C23C 8/36 (2013.01); C23C 8/02 (2013.01); H01L 21/0234 (2013.01);
(Continued)

(58) Field of Classification Search
CPC combination set(s) only.
See application file for complete search history.

(56) References Cited

U.S. PATENT DOCUMENTS 6,451,662 B1 9/2002 Chudzik et al.
6,486,020 B1 11/2002 Thakur et al.
(Continued)

FOREIGN PATENT DOCUMENTS

JP S55-018054 A 2/1980
JP S-5518054 A * 2/1980 ........... H01L 21/318
(Continued)

OTHER PUBLICATIONS

International Search Report and Written Opinion for Application No. PCT/US2017/035151; dated Aug. 24, 2017.
(Continued)

Primary Examiner — Nduka E Ojeh
(74) Attorney, Agent, or Firm — Patterson + Sheridan, LLP

(57) ABSTRACT

Embodiments disclosed herein generally related to system for forming a semiconductor structure. The processing chamber includes a chamber body, a substrate support device, a quartz envelope, one or more heating devices, a gas injection assembly, and a pump device. The chamber body defines an interior volume. The substrate support device is configured to support one or more substrates during processing. The quartz envelope is disposed in the processing chamber. The quartz envelope is configured to house the substrate support device. The heating devices are disposed about the quartz envelope. The gas injection assembly is coupled to the processing chamber. The gas injection assembly is configured to provide an $NH_3$ gas to the interior volume of the processing chamber. The pump device is coupled to the processing chamber. The pump device is configured to maintain the processing chamber at a pressure of at least 10 atm.

20 Claims, 4 Drawing Sheets

Related U.S. Application Data

(60) Provisional application No. 62/343,919, filed on Jun. 1, 2016.

(51) Int. Cl.
| | | |
|---|---|---|
| *H01L 21/3115* | (2006.01) | |
| *H01L 27/115* | (2017.01) | |
| *C23C 8/36* | (2006.01) | |
| *C23C 8/02* | (2006.01) | |

(52) U.S. Cl.
CPC .... *H01L 21/02323* (2013.01); *H01L 21/3115* (2013.01); *H01L 21/76814* (2013.01); *H01L 21/76816* (2013.01); *H01L 21/76826* (2013.01); *H01L 21/76831* (2013.01); *H01L 27/115* (2013.01)

(56) References Cited

U.S. PATENT DOCUMENTS

| | | |
|---|---|---|
| 7,491,563 B2 | 2/2009 | Buehrer et al. |
| 2003/0232512 A1 | 12/2003 | Dickinson et al. |
| 2005/0215026 A1 | 9/2005 | Ohashi et al. |
| 2008/0102650 A1 | 5/2008 | Adams et al. |
| 2010/0244206 A1* | 9/2010 | Bu .................. H01L 29/495 |
| | | 257/635 |
| 2010/0248497 A1* | 9/2010 | Bevan ............... H01L 29/40114 |
| | | 438/786 |
| 2013/0302916 A1* | 11/2013 | Kim .................... H01L 21/324 |
| | | 438/5 |
| 2014/0342543 A1 | 11/2014 | Ganguly et al. |
| 2015/0215026 A1* | 7/2015 | Zuo .................... H04B 1/18 |
| | | 455/289 |
| 2015/0235953 A1* | 8/2015 | Tsao ................. H01L 21/76843 |
| | | 257/742 |

FOREIGN PATENT DOCUMENTS

| | | |
|---|---|---|
| JP | S57-010242 A | 1/1982 |
| JP | 2001-035917 A | 2/2001 |
| JP | 2009-539231 A | 11/2009 |
| JP | 4959733 B2 | 6/2012 |
| KR | 10-2005-0019129 A | 2/2005 |
| KR | 10-2005-0056391 A | 6/2005 |
| KR | 10-2008-0074501 A | 8/2008 |
| WO | 2007091784 A1 | 8/2007 |

OTHER PUBLICATIONS

Japanese Office Action dated Mar. 3, 2020 for JP Application No. 2018-562292.

Korean Office Action issued to 10-2018-7038055 dated Feb. 4, 2020.

* cited by examiner

HIGH PRESSURE AMMONIA NITRIDATION OF TUNNEL OXIDE FOR 3D NAND APPLICATIONS

CROSS-REFERENCE TO RELATED APPLICATION

This application is a divisional of co-pending U.S. patent application Ser. No. 15/609,977, filed May 31, 2017, which claims priority from U.S. Provisional Application Ser. No. 62/343,919, filed Jun. 1, 2016, each of which is hereby incorporated by reference in its entirety.

BACKGROUND

Field

Embodiments disclosed herein generally related to a system for forming a semiconductor structure, and a method of doing the same.

Description of the Related Art

As the structure size of integrated circuit (IC) devices is scaled down to sub-quarter micron dimensions, electrical resistance, and current densities have become an area for concern and improvement. Multilevel interconnect technology provides the conductive paths throughout an IC device, and are formed in high aspect ratio features including contacts, plugs, vias, lines, wires, and other features. A typical method for forming an interconnect on a substrate includes depositing one or more layers, etching at least one of the layer(s) to form one or more features, depositing a barrier layer in the feature(s), and depositing one or more layers to fill the feature. Typically, a feature (or via) is formed in an oxide material disposed on a substrate.

Plasma nitridation has been used to nitride (i.e., incorporate nitrogen into) the oxide layer. This technique results in high nitrogen concentration on a surface of the oxide layer. As the demand for higher aspect ratios increase, it becomes increasingly more difficult to nitride the oxide layer. This is due to a combination of the average lifetime of the nitrogen compounds used in conventional nitridation processes, and the depth of the features in higher aspect ratios. Conventional processes are unable to adequately nitride the entire feature formed in the oxide layer.

Thus, an improved processing chamber and method for forming a semiconductor structure are needed.

SUMMARY

Embodiments disclosed herein generally related to system for forming a semiconductor structure. The processing chamber includes a chamber body, a substrate support device, a quartz envelope, one or more heating devices, a gas injection assembly, and a pump device. The chamber body defines an interior volume. The substrate support device is configured to support one or more substrates during processing. The quartz envelope is disposed in the processing chamber. The quartz envelope is configured to house the substrate support device. The heating devices are disposed about the quartz envelope. The gas injection assembly is coupled to the processing chamber. The gas injection assembly is configured to provide an NH3 gas to the interior volume of the processing chamber. The pump device is coupled to the processing chamber. The pump device is configured to maintain the processing chamber at a pressure of at least 10 atm.

In another embodiment, a system for forming a semiconductor structure is disclosed herein. The system includes a transfer chamber and a plurality of processing chambers. The plurality of processing chambers is coupled to the transfer chamber. At least one of the plurality of processing chambers includes a chamber body, a substrate support device, a quartz envelope, one or more heating devices, a gas injection assembly, and a pump device. The chamber body defines an interior volume. The substrate support device is configured to support one or more substrates during processing. The quartz envelope is disposed in the processing chamber. The quartz envelope is configured to house the substrate support device. The heating devices are disposed about the quartz envelope. The gas injection assembly is coupled to the processing chamber. The gas injection assembly is configured to provide an NH3 gas to the interior volume of the processing chamber. The pump device is coupled to the processing chamber. The pump device is configured to maintain the processing chamber at a pressure of at least 10 atm.

In another embodiment, a method of forming a semiconductor structure on a substrate is formed herein. An oxide layer is formed on the surface of the substrate. A via is formed in the oxide layer. The via extends at least partially into the oxide layer. The oxide layer is exposed to NH3. The chamber pressure is maintained at a pressure of at least 10 atm while the oxide layer is exposed to NH3.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
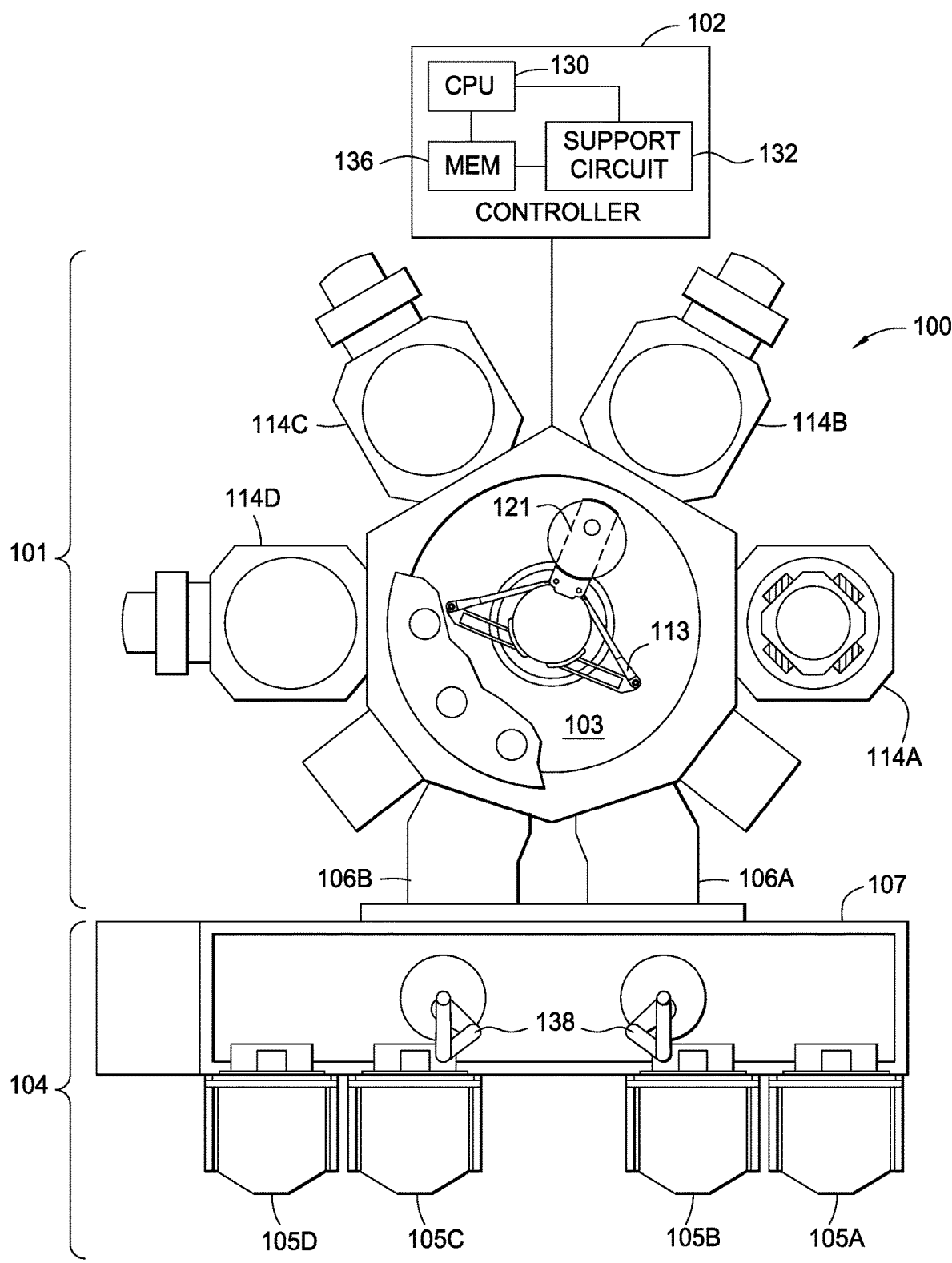
FIG. 1 is a schematic view of an integrated tool 100 for processing semiconductor substrates in which embodiments of the disclosure may be practiced.

FIG. 1 is a schematic view of an integrated tool 100 for processing semiconductor substrates in which embodiments of the disclosure may be practiced. Examples of suitable integrated tools include the CENTURA® and ENDURA® integrated tools, all available from Applied Materials, Inc. of Santa Clara, Calif. It is contemplated that the methods described herein may be practiced in other tools having the requisite process chambers coupled thereto, including those from other manufacturers.

The integrated processing tool 100 includes a vacuum-tight processing platform 101, a factory interface 104, and a system controller 102. The platform 101 has a plurality of processing chambers 114A-114D and loadlock chambers 106A-106B that are coupled to a vacuum substrate transfer chamber 103. The factory interface 104 is coupled to the transfer chamber 103 by the loadlock chambers 106A-106B.

In one embodiment, the factory interface 104 includes at least one docking station 107 and at least one factory interface robot 138. The docking station 107 is configured to accept one or more front opening unified pods (FOUPs). Four FOUPs 105A-105D are shown in the embodiment of FIG. 1. The factory interface robot 138 is configured to transfer substrates in the factory interface 104 between the FOUPs 105A-105D and the loadlock chambers 106A-106B.

The loadlock chambers 106A-106B have a first port coupled to the factory interface 104 and a second port coupled to the transfer chamber 103. The loadlock chambers 106A-106B are coupled to a pressure control system (not shown) which pumps down and vents the chambers 106A-106B to facilitate passing the substrate between the vacuum environment of the transfer chamber 103 and the substantially ambient (e.g., atmospheric) environment of the factory interface, The transfer chamber 103 has a vacuum robot 113 disposed therein. The vacuum robot 113 is capable of transferring substrates 121 between the loadlock chamber 106A-106B and the processing chambers 114A-114D.

In one embodiment, the processing chambers coupled to the transfer chamber 103 may be a chemical vapor deposition (CVD) chamber 114D, a plasma nitridation chamber 114C, a rapid thermal process (RTP) chamber 114B, or an atomic layer deposition (ALD) chamber 114A. The particular chambers shown coupled to the transfer chamber 103 are examples of chambers that may be coupled to the transfer chamber 103. Alternatively, different processing chambers, including at least one of ALD, CVD, metal organic chemical vapor deposition (MOCVD), physical vapor deposition (PVD), plasma nitridation, or RTP chambers may be interchangeably incorporated into the integrated processing tool 100 in accordance with process requirements.

The system controller 102 is coupled to the integrated processing tool 100. The system controller 102 controls the operation of the integrated processing tool 100 by direct control of the processing chambers 114A-114D of the integrated processing tool 100, or alternatively, by controlling the computers (or controllers) associated with the processing chambers 114A-114D of the integrated processing tool 100. In operation, the system controller 102 enables data collection and feedback from the respective chambers and system to optimize performance of the integrated processing tool 100.

The system controller 102 generally includes a central processing unit (CPU) 130, memory 136, and support circuit 132. The CPU 130 may be one of any form of a general purpose computer processor that can be used in an industrial setting. The support circuits 132 are conventionally coupled to the CPU 130 and may comprise cache, clock circuits, input/output subsystems, power supplies, and the like. The software routines when executed by the CPU 130 transform the CPU into a specific purpose computer (controller) and enable processes, such as the method described in conjunction with FIG. 3, to be performed on the integrated processing tool 100. The software routines may also be stored and/or executed by a second controller (not shown) that is located remotely from the integrated processing tool 100.

Figure 2:
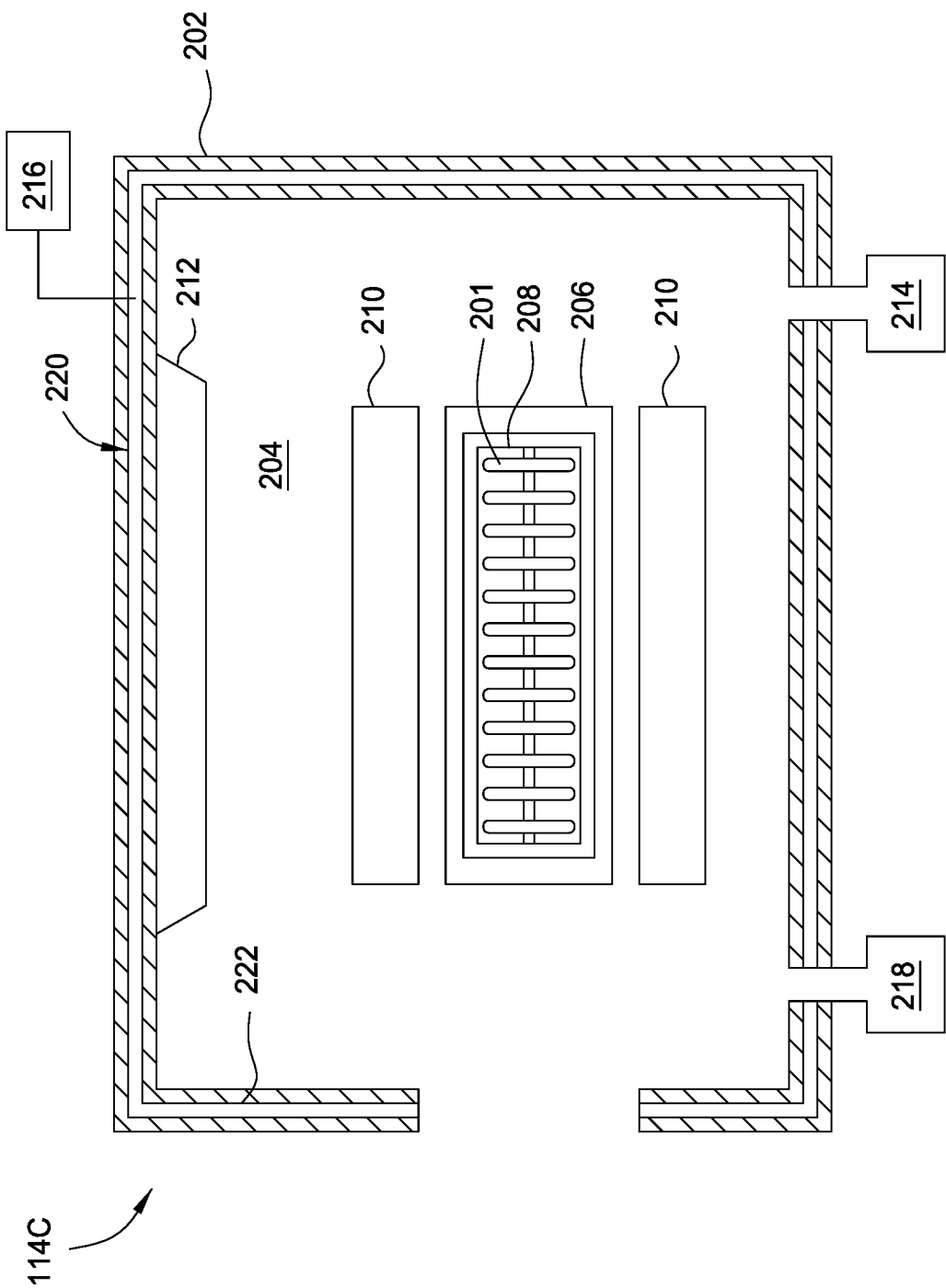
FIG. 2 is a cross-sectional view of a plasma nitridation chamber, according to one embodiment.

FIG. 2 is a cross-sectional view of a plasma nitridation chamber 114C according to one embodiment. The plasma nitridation chamber 114C includes a chamber body 202 defining an interior volume 204. The plasma nitridation chamber 114C further includes a quartz envelope 206. The quartz envelope 206 is configured to house a substrate support device 208. The substrate support device 208 is configured to support one or more substrates 201 in the plasma nitridation chamber 114C. In the embodiment shown in FIG. 2, the substrate support device 208 is configured to support one or more substrates 201 in a vertical orientation in the quartz envelope 206.

The plasma nitridation chamber 114C further includes a plurality of heating elements 210. The plurality of heating elements 210 is positioned about the quartz envelope 206. The plurality of heating elements 210 is configured to heat the quartz envelope 206 to a desired temperature. For example, the plurality of heating elements 210 may heat the quartz envelope 206 to a temperature between 600° C. and 1,200° C.

The plasma nitridation chamber 114C may further include a gas injection assembly 212 coupled to a gas source 216, a pump device 214, and an exhaust assembly 218. The gas injection assembly 212 is configured to provide a gas to the interior volume 204 of the chamber 114C. In one embodiment, the gas source 216 is configured to provide NH3 gas to the interior volume 204 and inside the quartz envelope 206, such that the nitridation rate of the one or more substrates 201 is increased. The $NH_3$ gas may be provided, in neat (i.e. 100%), concentrated (i.e. 50% up to 100%), or dilute (i.e. <50%) form, at a flow rate of 1 sLm to 20 sLm, for example 10 sLm. The pump device 214 is coupled to the nitridation chamber 114C, in communication with the interior volume 204. The pump device 214 is configured to control a pressure of the interior volume 204 of the chamber 114C. For example, the pump device 214 is configured to maintain a pressure of between 10-20 atmospheres (atm) while the gas injection assembly 212 provides $NH_3$ gas to the interior volume 204. The exhaust assembly 218 may be disposed on an opposite side of the chamber 114C from the gas injection assembly 212. The exhaust assembly 218 is configured to remove the $NH_3$ gas from the chamber 114C.

The plasma nitridation chamber 114C may further include a temperature control device 220. The temperature control device 220 is configured to control a temperature of the chamber body 202 of the chamber 114C during processing. In one embodiment, the temperature control device may be in the form of thermal shield plates coupled to the chamber body 202. In the embodiment illustrated in FIG. 2, the temperature control device 220 is in the form of a cooling channel 222 formed in the chamber body 202. The cooling channel 222 is configured to flow a heat transfer fluid through the chamber body 202, to control the temperature of the chamber body 202 during processing.

Figure 3:
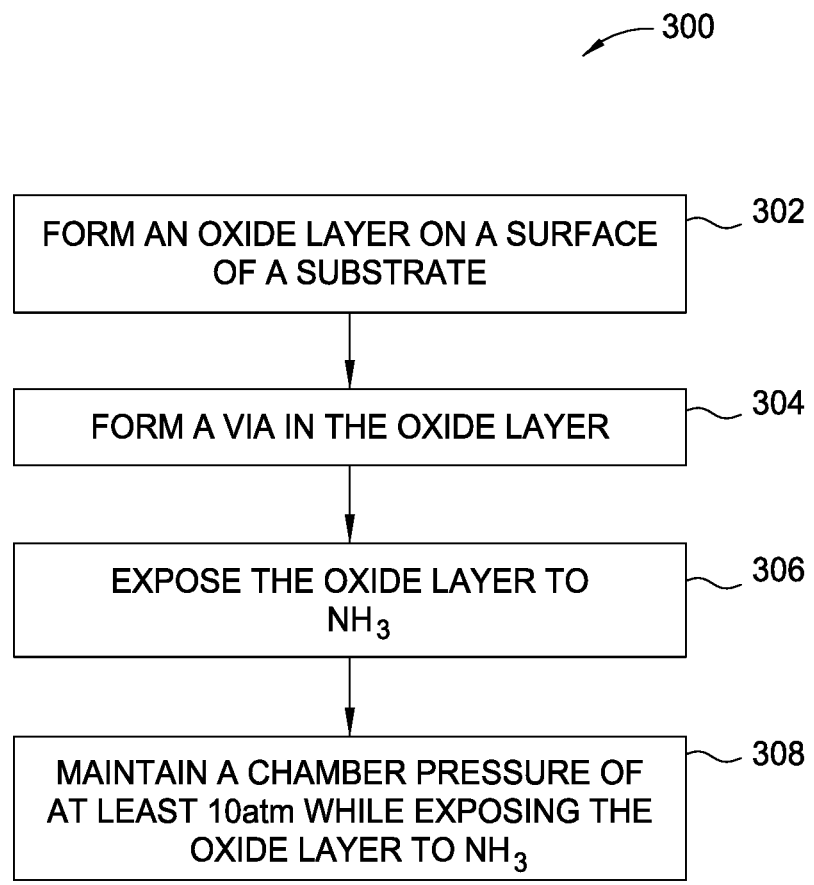
FIG. 3 is a flow diagram that illustrates a method of forming a semiconductor device, according to one embodiment.
Figure 4A:
FIGS. 4A-4C illustrate cross-sectional views of a substrate at different stages of the method of FIG. 3.
Figure 4B:
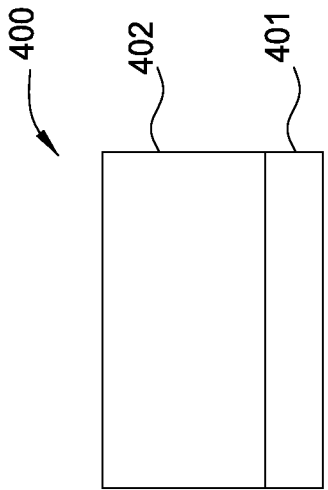
Figure 4C:
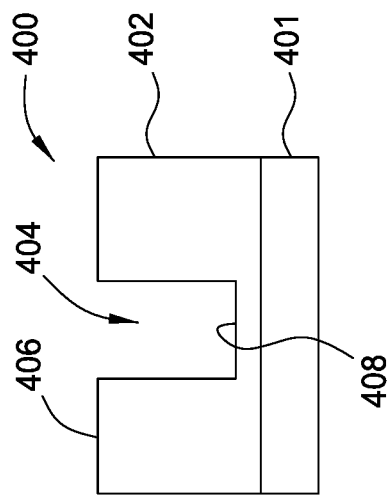

FIG. 3 is a flow diagram that illustrates a method 300 of forming a semiconductor device 400, according to one embodiment. FIGS. 4A-C illustrate cross-sectional views of a substrate 401 at different stages of the method 300 of FIG. 3. FIG. 4A depicts the substrate 401 without any layers deposited thereon. The method 300 begins at block 302. At block 302, an oxide layer 402 is formed on the substrate 401. In one embodiment, the oxide layer 402 may be formed from SiO2. The oxide layer 402 may be formed on the substrate 401 in a process chamber such as one of the processing chambers 114A-114D in FIG. 1. For example, the oxide layer 402 may be formed in the RADIANCE® system, available from Applied Materials, Inc. The oxide layer 402 may be deposited on the substrate 401 through CVD, rapid thermal-CVD (RT-CVD), plasma enhanced-CVD (PECVD), physical vapor deposition (PVD), ALD, or combinations thereof. In one embodiment, the oxide layer 402 may have a thickness between about 1.5 nm to about 3 nm.

At block 304, a via 404 is formed in the Oxide layer 402, as shown in FIG. 4C. The via 404 may extend partially into the Oxide layer 402, from a top surface 406 of the Oxide layer.

At block 306, the substrate 401 having the Oxide layer 402 deposited thereon, is transferred to a plasma nitridation chamber, such as the plasma nitridation chamber 114C, to undergo a nitridation process. During the nitridation process, the oxygen on the surface of the oxide layer 402 is replaced by nitrogen. In one embodiment, about 40% of the oxygen in the oxide layer 402 is replaced with nitrogen. Conventionally, NH$_2$ and NH have been used for nitridation processes. Due to the higher electronegativity of oxygen compared to nitrogen, highly reactive species are typically used to displace oxygen in such processes. N*, NH$_2$, and NH have however proven to be too unstable to live long enough to travel down the high aspect ratio features in the Oxide layer and conformally nitride the feature. To penetrate to the bottom of such features at concentrations that support conformal nitridation, the nitriding species need to survive one or more wall contact events without sticking, reacting, or extinguishing. Reduced reactivity species, or species having lower sticking coefficient, are needed. NH$_2$ and NH may quickly relax back to N$_2$ and H$_2$ when they react with the oxide, resulting in a short residence time in the via 404. For example, the average lifetime of NH$_2$ and NH may be about 10 ms. Additionally, it is difficult to lower reactivity and yet still have sufficient energy to nitride the oxide. By substituting NH$_3$ for NH and NH$_2$, the conformal nitridation process with a high temperature NH$_3$ is driven by the partial pressure of NH3, and enhances the nitridation process. It has been found that while increases in processing temperature and processing time increase the number of nitrogen atoms in NH$_3$ incrementally, the increase in pressure, particularly the increase in partial pressure, of NH3 during processing increases the number of nitrogen atoms at a greater rate.

At block 306, the substrate is exposed to NH$_3$, as shown in FIG. 4C. The reaction of NH$_3$ and SiO$_2$ yields:

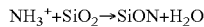

$$NH_3^+ + SiO_2 \rightarrow SiON + H_2O$$

The temperature needed to drive the reaction forward is at least 600° C. In one embodiment, the temperature is about 1000° C. The NH3 is provided to the substrate at a flow rate of about 1 sLm to 20 sLm, for example 10 sLm. As noted above, the NH3 may be provided in neat, concentrated, or dilute form. The NH$_3$ is configured to travel to a bottom 408 of the via 404.

At block 308, the processing chamber is maintained at a pressure of at least 10 atm while the substrate is exposed to NH$_3$. In one embodiment, the pressure of the processing chamber is maintained at a pressure between 10 atm and 20 atm.

While the foregoing is directed to specific embodiments, other and further embodiments may be devised without departing from the basic scope thereof, and the scope thereof is determined by the claims that follow.

What is claimed is:

1. A method of forming a semiconductor structure, comprising:

forming an oxide layer with a thickness between 1.5 nm and 3 nm on a surface of a substrate;
    forming a via in the oxide layer, the via extending at least partially into the oxide layer;
    exposing the oxide layer to NH$_3$ to perform a plasma nitridation process on the oxide layer; and
    maintaining a chamber pressure of at least 10 atm while exposing the oxide layer to NH$_3$ during the plasma nitridation process.

2. The method of claim 1, further comprising maintaining a chamber temperature of at least 600° C.

3. The method of claim 2, wherein the chamber temperature is about 1000° C.

4. The method of claim 1, wherein the chamber pressure is maintained between about 10 atm and 20 atm.

5. The method of claim 1, wherein the NH$_3$ is provided to a chamber containing the substrate at a flow rate between 1 slm to 20 slm.

6. The method of claim 1, wherein the oxide layer comprises silicon oxide.

7. The method of claim 1, wherein, the oxide layer is deposited on the substrate by at least one of chemical vapor deposition (CVD), rapid thermal-CVD (RT-CVD), plasma enhanced-CVD (PECVD), physical vapor deposition (PVD), and atomic layer deposition (ALD).

8. The method of claim 1, wherein about 40% of oxygen in the oxide layer is replaced with nitrogen.

9. A method of forming a semiconductor structure, comprising:

positioning a plurality of substrates in a quartz envelope disposed in an interior volume of a chamber, the substrate having a surface with an oxide layer formed thereon, the oxide layer having a via extending at least partially therein; and
    introducing a flow of NH$_3$ to inside the quartz envelope, the introducing the flow of NH$_3$ to inside the quartz envelope comprising:
        providing NH$_3$ to a gas injection assembly disposed in the interior volume of the chamber;
        flowing the NH$_3$ to the interior volume outside of the quartz envelope and then to the inside of the quartz envelope at a flow rate; and
        maintaining a pressure of at least 10 atm in the interior volume while flowing the NH$_3$ to the interior volume outside of the quartz envelope and then to the inside of the quartz envelope to perform a plasma nitridation process on the plurality of substrates.

10. The method of claim 9, further comprising maintaining a temperature of at least 600° C. in the interior volume while flowing the NH$_3$ to the interior volume outside of the quartz envelope and then to the inside of the quartz envelope.

11. The method of claim 10, wherein the temperature is about 1000° C.

12. The method of claim 9, wherein the pressure is maintained between about 10 atm and 20 atm.

13. The method of claim 9, wherein the flow rate is between 1 slm to 20 slm.

14. The method of claim 9, wherein the oxide layer comprises silicon oxide.

15. The method of claim 9, wherein, the oxide layer is deposited on the substrate by at least one of chemical vapor deposition (CVD), rapid thermal-CVD (RT-CVD), plasma enhanced-CVD (PECVD), physical vapor deposition (PVD), and atomic layer deposition (ALD).

16. A method of forming a semiconductor structure, comprising:

positioning a plurality of substrates in contact with a substrate holder in a quartz envelope disposed in an interior volume of a chamber, the substrates each having a surface with an oxide layer formed thereon, the oxide layer having a via extending at least partially therein;

heating the plurality of substrates with a heater positioned within the interior volume of the chamber and outside of the quartz envelope; and introducing a flow of $NH_3$ to inside the quartz envelope, the introducing the flow of $NH_3$ to inside the quartz envelope comprising:

provising $NH_3$ to a gas injection assembly disposed in the interior volume of the chamber;

flowing the $NH_3$ to the interior volume outside of the quartz envelope and then to the inside of the quartz envelope at a flow rate;

maintaining a temperature of at least 600° C. in the interior volume while flowing the $NH_3$ to the interior volume outside of the quartz envelope and then to the inside of the quartz envelope; and maintaining a pressure of at least 10 atm in the interior volume while flowing the $NH_3$ to the interior volume outside of the quartz envelope and then to the inside of the quartz envelope to perform a plasma nitridation process on the plurality of substrates.

17. The method of claim 16, wherein the temperature is about 1000° C.

18. The method of claim 16, wherein the pressure is maintained between about 10 atm and 20 atm.

19. The method of claim 16, wherein the flow rate is between 1 slm to 20 slm.

20. The method of claim 16, wherein the oxide layer comprises silicon oxide.

* * * * *